United States Patent
Sung

(10) Patent No.: US 6,657,903 B2
(45) Date of Patent: Dec. 2, 2003

(54) CIRCUIT FOR GENERATING POWER-UP SIGNAL

(75) Inventor: Ha Min Sung, Chungcheongbuk-do (KR)

(73) Assignee: Hynix Semiconductor Inc., Ich'on (KR)

( * ) Notice: Subject to any disclaimer, the term of this patent is extended or adjusted under 35 U.S.C. 154(b) by 165 days.

(21) Appl. No.: 10/028,323

(22) Filed: Dec. 28, 2001

(65) Prior Publication Data

US 2003/0039149 A1 Feb. 27, 2003

(30) Foreign Application Priority Data

Aug. 24, 2001 (KR) ......................................... 2001-51281

(51) Int. Cl.[7] ................................................. G11C 7/00
(52) U.S. Cl. ................... 365/189.09; 365/226; 327/540
(58) Field of Search ............................. 365/189.09, 226; 327/540, 538, 544

(56) References Cited

U.S. PATENT DOCUMENTS

| 5,920,208 | A | | 7/1999 | Park |
| 6,097,659 | A | * | 8/2000 | Kang ........................... 365/226 |
| 6,147,925 | A | | 11/2000 | Tomishima et al. |
| 6,184,730 | B1 | | 2/2001 | Kwong et al. |
| 6,198,344 | B1 | * | 3/2001 | Sung ........................... 327/545 |
| 6,205,079 | B1 | | 3/2001 | Namekawa |
| 6,512,398 | B1 | * | 1/2003 | Sonoyama et al. ........... 327/58 |

FOREIGN PATENT DOCUMENTS

| JP | 11-203869 | 7/1999 | ......... G11C/11/407 |
| JP | 11-260064 | 9/1999 | ......... G11C/11/419 |

* cited by examiner

*Primary Examiner*—Richard Elms
*Assistant Examiner*—Nam Nguyen
(74) *Attorney, Agent, or Firm*—Jacobson Holman PLLC

(57) ABSTRACT

A circuit for generating a power-up signal in a semiconductor memory device which can remove instability due to non-generation of a back bias voltage by detecting the back bias voltage of a memory cell internally generated when an external power voltage is applied, and detecting the external power voltage when the back bias voltage reaches a predetermined level, and which can improve the stability of the power-up signal by initializing an external power voltage detecting unit by using an initial start-up circuit.

6 Claims, 7 Drawing Sheets

CIRCUIT FOR GENERATING POWER-UP SIGNAL

BACKGROUND OF THE INVENTION

1. Field of the Invention

The present invention relates to a circuit for generating a power-up signal in a semiconductor memory device, and in particular to an improved circuit for generating a power-up signal which can stabilize a power-up operation by generating the power-up signal by detecting a back bias voltage and an external power voltage in order to prevent a latch-up from being generated due to increase of the back bias voltage by coupling of the source, drain and gate voltages of a memory cell transistor in an initial power-up operation.

2. Description of the Background Art

FIG. 1 is a circuit diagram illustrating a conventional circuit for generating a power-up signal. Referring to FIG. 1, in the circuit for generating the power-up signal, a resistor R and a capacitor C are connected in series between a power voltage VCC and a ground voltage VSS. When the power voltage VCC is applied, a voltage divided by the RC time constant of the resistor R and the capacitor C is charged through a node Nd1.

In addition, inverters IV1 and IV2 are connected in series between the node Nd1 and an output terminal. When the voltage of the node Nd1 is greater than a logic threshold voltage Vt of the inverter IV1, a power-up bar signal PUPB outputted to the output terminal has a low level.

On the other hand, internal circuits of a semiconductor memory device are not operated in a power-up operation. Here, the circuit for generating the power-up signal initializes the internal circuits that are to be stabilized.

However, the conventional circuit generates the power-up signal PUPB through an RC delay, and thus a considerable level difference is created in response to a power-up sequence. Therefore, when the external power voltage is low, the internal circuits are not successfully initialized, which may generate a current path. In addition, when the power-up operation is performed with an unstable back bias voltage, the back bias voltage is increased due to coupling of the source, drain and gate voltages of a memory cell transistor, thereby generating a latch-up.

SUMMARY OF THE INVENTION

Accordingly, it is an object of the present invention to provide a circuit for generating a power-up signal in a semiconductor memory device which can remove instability due to non-generation of a back bias voltage by detecting the back bias voltage of a memory cell internally generated when an external power voltage is applied, and detecting the external power voltage when the back bias voltage reaches a predetermined level, and which can improve stability of the power-up signal by initializing an external power voltage detecting unit by using an initial start-up circuit.

In order to achieve the above-described object of the invention, there is provided a circuit for generating a power-up signal in a semiconductor memory device including: a VBB level detecting unit for detecting a back bias voltage level; an external power voltage detecting unit controlled in response to the signal from the VBB level detecting unit, for detecting an external power voltage level; a start-up circuit unit for setting an initial value of the external power voltage detecting unit; an output unit controlled in response to the output signal from the VBB level detecting unit, for buffering and outputting the signal from the external power voltage detecting unit; and a connection unit for receiving the signal from the output unit, and controlling source, drain and gate voltages of a memory cell transistor.

In another aspect of the present invention, a circuit for generating a power-up signal in a semiconductor memory device includes: a VBB level detecting unit for detecting a back bias voltage level; an external power voltage detecting unit controlled in response to the signal from the VBB level detecting unit, for detecting an external power voltage level; a start-up circuit unit for setting an initial value of the external power voltage detecting unit; an output unit for buffering the signal from the external power voltage detecting unit; and a connection unit for receiving the signal from the output unit, and controlling source, drain and gate voltages of a memory cell transistor.

In still another aspect of the present invention, a circuit for generating a power-up signal in a semiconductor memory device includes: an external power voltage detecting unit for detecting an external power voltage in response to the active resistance ratio of a transistor; a start-up circuit unit for setting an initial value of the external power voltage detecting unit; an output unit for buffering the signal from the external power voltage detecting unit; and a connection unit for receiving the signal from the output unit, and controlling the source, drain and gate voltages of a memory cell transistor.

In still another aspect of the present invention, a circuit for generating a power-up signal in a semiconductor memory device includes: an external power voltage detecting unit for detecting an external power voltage in response to the active resistance ratio of a transistor; a start-up circuit unit for setting up an initial value of the external power voltage detecting unit; an output unit controlled in response to the output signal from the start-up circuit unit, for buffering the signal from the external power voltage detecting unit; and a connection unit for receiving the signal from the output unit, and controlling the source, drain and gate voltages of a memory cell transistor.

In still another aspect of the present invention, a circuit for generating a power-up signal in a semiconductor memory device includes: an internal power voltage detecting unit for detecting an internal power voltage level; an external voltage detecting unit controlled in response to the signal from the internal power voltage detecting unit, for detecting an external voltage level; a start-up circuit unit for setting an initial value of the external power detecting unit; an output unit controlled in response to the signal from the internal power voltage detecting unit, for buffering the signal from the external power detecting unit; and a connection unit for receiving the signal from the output unit, and controlling the source, drain and gate voltages of a memory cell transistor.

In still another aspect of the present invention, a circuit for generating a power-up signal in a semiconductor memory device includes: an internal power voltage detecting unit for detecting an internal power voltage level; an external power detecting unit controlled in response to the signal from the internal power voltage detecting unit, for detecting an external voltage level; a start-up circuit unit for setting up an initial value of the external power detecting unit; an output unit for buffering the signal from the external power detecting unit; and a connection unit for receiving the signal from the output unit, and controlling source, drain and gate voltages of a memory cell transistor.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A circuit for generating a power-up signal in a semiconductor memory device in accordance with preferred embodiments of the present invention will now be described in detail with reference to the accompanying drawings.

Figure 1:
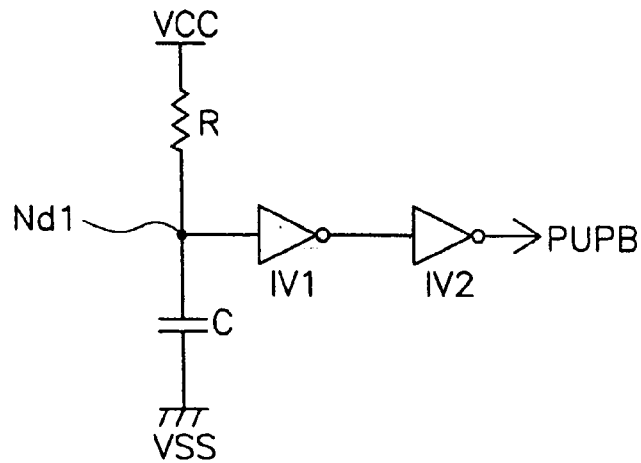
FIG. 1 is a circuit diagram illustrating a conventional circuit for generating a power-up signal.
Figure 2:
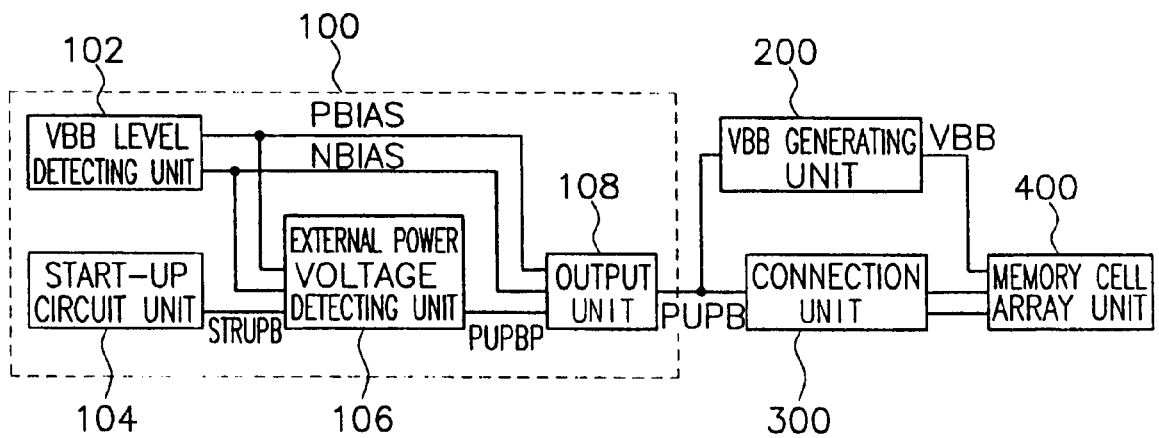
FIG. 2 is a block diagram illustrating a circuit for generating a power-up signal in accordance with a first embodiment of the present invention.

FIG. 2 is a block diagram illustrating a circuit for generating a power-up signal in accordance with a first embodiment of the present invention. Referring to FIG. 2, in a semiconductor memory device having a back bias voltage generating unit 200, a connection unit 300 and a memory cell array unit 400, the circuit for generating the power-up signal includes a VBB level detecting unit 102, a start-up circuit unit 104, an external power voltage detecting unit 106 and an output unit 108.

The VBB level detecting unit 102 generates signals PBIAS and NBIAS detecting the magnitude of a back bias voltage VBB.

The external power voltage detecting unit 106 is controlled in response to the detecting signals PBIAS and NBIAS from the VBB level detecting unit 102, for generating a signal PUPBP detecting an external power voltage. The external power voltage detecting unit 106 is initialized in response to a start-up signal STRUPB from the start-up circuit unit 104.

The start-up circuit unit 104 generates the start-up signal STRUPB setting an initial value of the external power voltage detecting unit 106.

The output unit 108 is controlled in response to the detecting signals PBIAS and NBIAS from the VBB level detecting unit 102, for buffering the detecting signal PUPBP from the external power voltage detecting unit 106, and outputting a power-up signal PUPB.

The connection unit 300 receives the power-up signal PUPB from the output unit 108, and controls the source, drain and gate voltages of a memory cell transistor of the memory cell array unit 400.

It is thus possible to prevent a latch-up due to non-generation of the back bias voltage of the memory cell by generating the power-up signal PUPB by detecting the back bias voltage VBB of the memory cell that is internally generated when the external power voltage is applied, and detecting the external power voltage when the back bias voltage reaches a predetermined level. In addition, the power-up signal PUPB is stabilized by initializing the external power voltage detecting unit 106 by using the start-up circuit unit 104.

Figure 3:
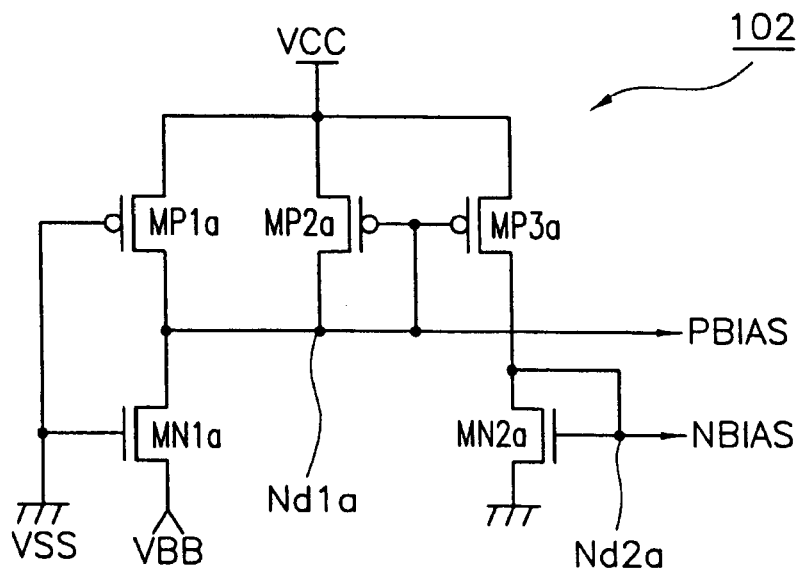
FIG. 3 is a circuit diagram illustrating a VBB level detecting unit of the circuit of FIG. 2.

FIG. 3 is a circuit diagram illustrating the VBB level detecting unit of FIG. 2. Referring to FIG. 3, the VBB level detecting unit 102 includes: a PMOS transistor MP1a connected between a power voltage VCC and a node Nd1a outputting the bias voltage PBIAS, and having its gate connected to receive a ground voltage VSS; an NMOS transistor MN1a connected between the node Nd1a and the back bias voltage VBB, and having its gate connected to receive the ground voltage VSS; a PMOS transistor MP2a connected between the power voltage VCC and the node Nd1a, and having its gate connected to receive the signal from the node Nd1a; a PMOS transistor MP3a connected between the power voltage VCC and a node Nd2a outputting the bias voltage NBIAS, and having its gate connected to receive the signal from the node Nd1a; and an NMOS transistor MN2a connected between the node Nd2a and the ground voltage VSS, and having its gate connected to receive the signal NBIAS.

In the VBB level detecting unit 120, when the back bias voltage VBB is lowered to a specific level, the NMOS transistor MNa is turned on to form a current path from the power voltage VCC to the back bias voltage VBB. Accordingly, the bias voltages PBIAS and NBIAS are generated in response to the magnitude ratio of the PMOS transistors MP1a–MP3a.

Figure 4:
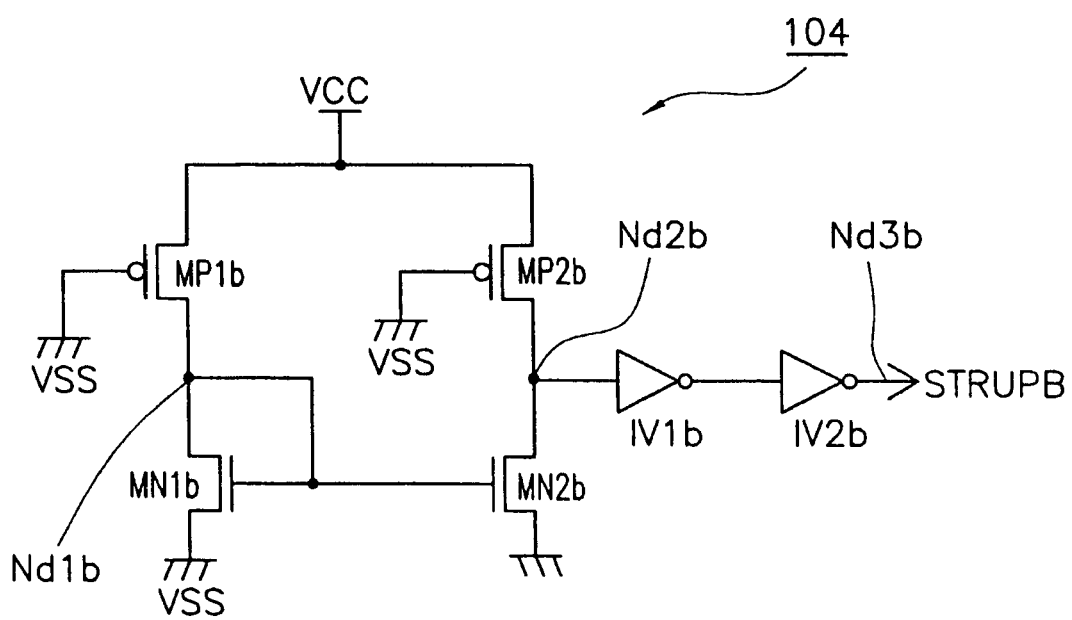
FIG. 4 is a circuit diagram illustrating a start-up circuit unit of the circuit of FIG. 2.

FIG. 4 is a circuit diagram illustrating the start-up circuit unit 104 of the circuit of FIG. 2. As shown in FIG. 4, the start-up circuit unit 104 includes: a PMOS transistor MP1b connected between the power voltage VCC and a node Nd1b, and having its gate connected to receive the ground voltage VSS; an NMOS transistor MN1b connected between the node Nd1b and the ground voltage VSS, and having its gate connected to receive the signal from the node Nd1b; a PMOS transistor MP2b connected between the power voltage VCC and a node Nd2b, and having its gate connected to receive the ground voltage VSS; an NMOS transistor MN2b connected between the node Nd2b and the ground voltage VSS, and having its gate connected to receive the signal from the node Nd1b; and inverters IV1b and IV2b connected in series between the node Nd2b and a node Nd3b outputting the start-up signal STRUPB.

In the start up circuit unit 104, when the PMOS transistor MP1b is turned on due to the applied external power voltage VCC and the potential of the node Nd1b is increased, the NMOS transistor MN2b is turned on, and thus the potential of the node Nd2b is gradually reduced. Here, when the potential of the node Nd2b reaches the threshold voltage Vt of the inverter IV1b, the start-up signal STRUPB outputted to the output node Nd3b has a low level.

As a result, when the external power voltage VCC is initially applied, the start-up circuit unit 104 serves to initialize the power-up signal PUPB through the PMOS transistor MP1 and the NMOS transistor MN1.

Figure 5:
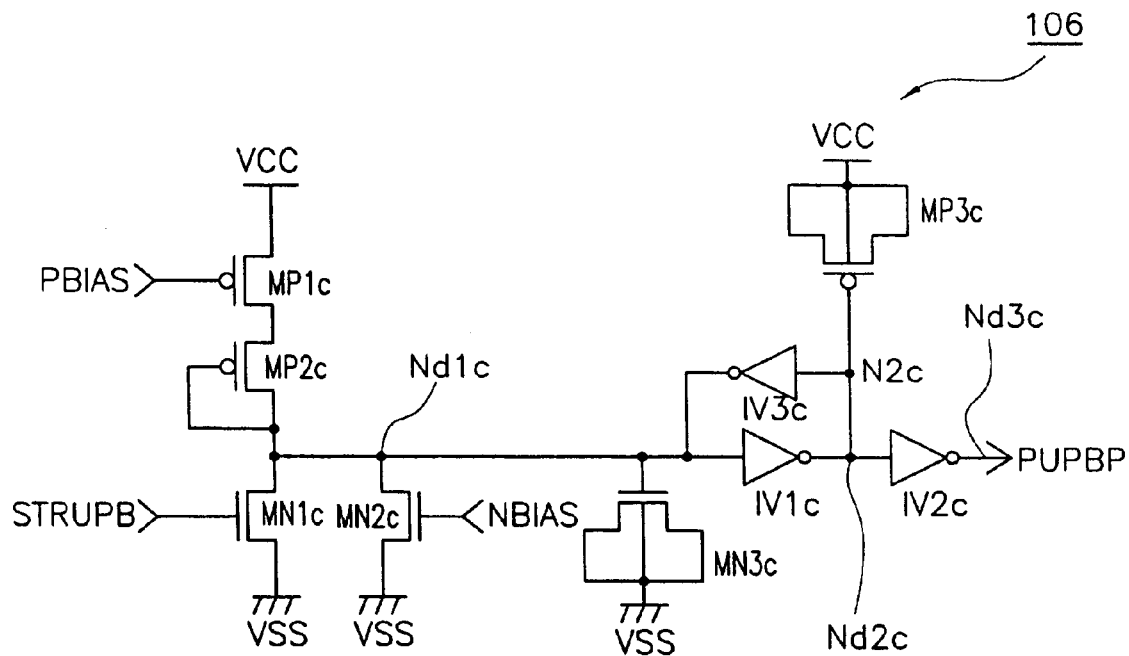
FIG. 5 is a circuit diagram illustrating an external power detecting unit of the circuit of FIG. 2.

FIG. 5 is a circuit diagram illustrating the external power voltage detecting unit 106 of the circuit of FIG. 2. As depicted therein, the external power voltage detecting unit 106 includes: PMOS transistors MP1c and MP2c connected in series between the power voltage VCC and a node Nd1c, and respectively controlled in response to the bias voltage PBIAS from the VBB level detecting unit 102 and the node Nd1c; an NMOS transistor MN1c connected between the node Nd1c and the ground voltage VSS, and controlled in response to the signal STRUPB from the startup circuit unit 144; an NMOS transistor MN2c connected between the node Nd1c and the ground voltage VSS, and controlled in response to the bias voltage NBIAS from the VBB level detecting unit 102; an NMOS transistor MN3c connected in a capacitor structure between the node Nd1c and the ground voltage VSS; an inverter IV1c for receiving the signal of the node Nd1c, and outputting an inverted signal to a node Nd2c; an inverter IV3c for receiving the signal from the node Nd2c, and outputting an inverted signal to the node Nd1c; an inverter IV2c for receiving the signal from the node Nd2c, and outputting an inverted signal to a node Nd3c; and a PMOS transistor MP3c connected in a capacitor structure between the node Nd2c and the ground voltage VSS.

The external power voltage detecting unit 106 receives the output signals from the VBB level detecting unit 102 and the start-up circuit unit 104, and detects the external voltage. When the external power voltage is initially applied, the external power voltage detecting unit 106 enables the node Nd1c to have a low level in response to the start-up signal SRTUPB. When the VBB level is below a specific level, the external power voltage detecting unit 106 detects the external voltage VCC and generates the output signal PUPBP.

Figure 6:
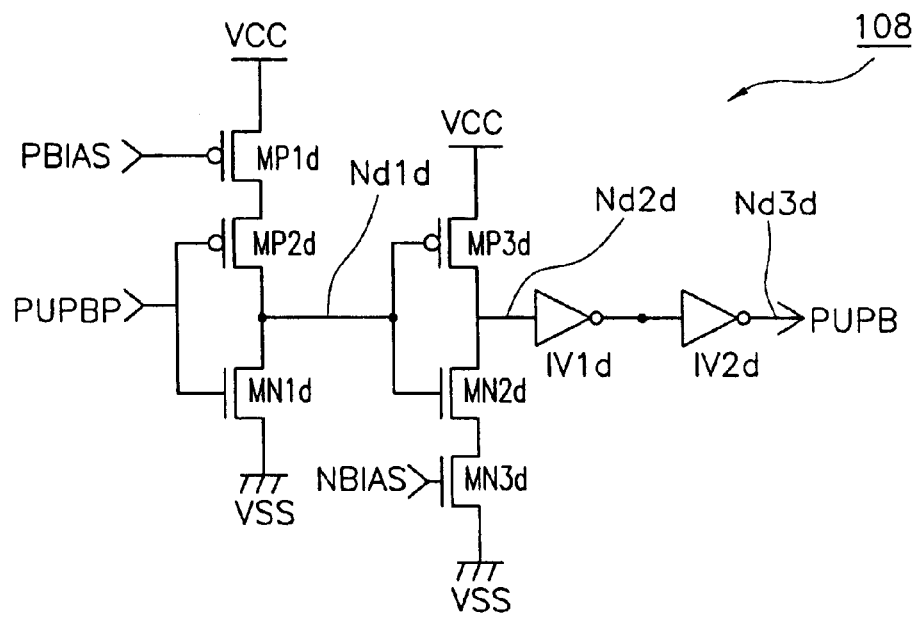
FIG. 6 is a circuit diagram illustrating an output unit of the circuit of FIG. 2.

FIG. 6 is a circuit diagram illustrating the output unit 108 of FIG. 2. As shown in FIG. 6, the output unit 108 includes: PMOS transistors MP1d and MP2d connected in series between the power voltage VCC and a node Nd1d, and respectively controlled in response to the bias voltage PBIAS from the VBB level detecting unit 102 and the output signal PUPBP from the external power voltage detecting unit 106; an NMOS transistor MN1d connected between the node Nd1d and the ground voltage VSS, and controlled in response to the signal PUPBP from the external power voltage detecting unit 106; a PMOS transistor MP3d connected between the power voltage VCC and a node Nd2d, and controlled in response to the signal of the node Nd1d; NMOS transistors MN2d and MN3d connected in series between the node Nd2d and the ground voltage VSS, and respectively controlled in response to the signal from the node Nd1d and the bias voltage NBIAS from the VBB level detecting unit 102; and inverters IV1d and IV2d connected in series between the node Nd2d and an output node Nd3d.

In the output unit 108, one end clock inverter receives the output from the VBB level detecting unit 102, a path is formed to output a high level signal when the external power voltage is initially applied, and a path where the output is transformed to a low level is controlled in response to the output from the VBB level detecting unit 102.

When the output signal PUPB from the output unit 108 has a high level, the VBB voltage generating unit 200 forcibly performs a pumping operation regardless of the level detection result.

Figure 7:
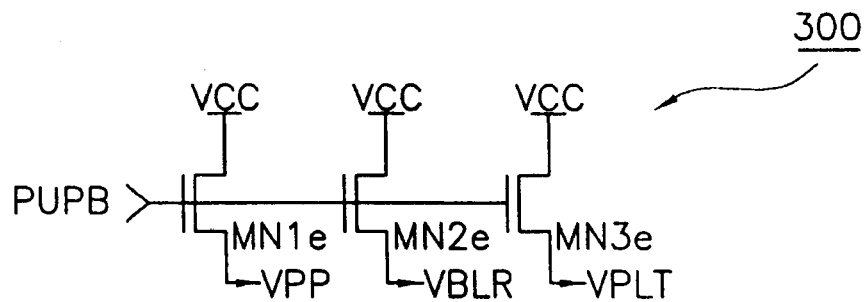
FIG. 7 is a circuit diagram illustrating a connection unit of the circuit of FIG. 2.

FIG. 7 is a circuit diagram illustrating the connection unit 300 of the circuit of FIG. 2. As illustrated in FIG. 7, the connection unit 300 includes NMOS transistors MN1e–MN3e controlled in response to the output signal PUPB from the output unit 108. In the power-up operation initialized by the signal PUPB, the connection unit 300 enables the source, gate and drain voltages VBLP, VPP and VPLT of the memory cell transistor to have identical potentials.

Figure 8:
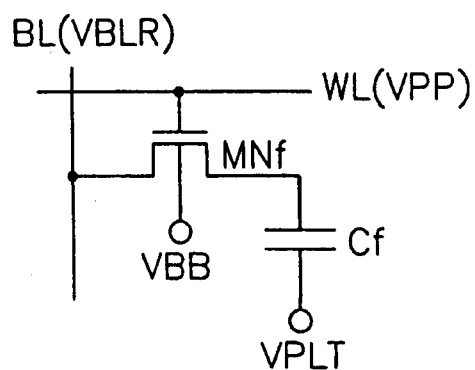
FIG. 8 is a circuit diagram illustrating a memory cell of a memory cell array unit the circuit of FIG. 2.

FIG. 8 is a circuit diagram illustrating a unit memory cell of the memory cell array unit 400 of the circuit of FIG. 2, including one NMOS transistor MNf and one capacitor Cf.

When the external voltage is applied, the output signal PUPB from the output unit 108 has a high level from the start-up circuit unit 104. Since the power-up signal PUPB has a high level, the VBB voltage generating unit 200 performs the VBB pumping operation to lower the VBB voltage. Conversely, the word line driving voltage VPP, the bit line driving voltage VBLP and the cell plate voltage VPLT are caused to drop by the external voltage VCC by the threshold voltage Vt of the NMOS transistor by the NMOS transistors MN1e–MN3e of the connection unit 300, and linearly increased. Accordingly, in the four terminals of the cell transistor, the source, gate and drain have the identical potential, and the back bias voltage has a negative value. As a result, a PN junction diode among the bulk, the source and the drain is never turned on.

When the external voltage is initially applied in a general triple well structure, the VBB potential is increased due to coupling with a P well bias potential in a deep N well. The increased VBB voltage may cause a latch-up.

When the output signal from the start-up circuit unit 104 has a low level and the VBB voltage reaches a specific level, the VBB level detecting unit 102 generates the bias voltages PBIAS and NBIAS detecting the VBB level, and the external power voltage detecting unit 106 generates the signal PUPBP detecting the external voltage.

When the external voltage is above a predetermined level, the node Nd1c of the external power voltage detecting unit 106 exceeds the logic threshold voltage Vt of the inverter IV1c, and thus the power-up signal PUPB has a low level. When the power-up signal PUPB has a low level, all registers of the chip are initialized, and the back bias voltage of the memory cell is stabilized, thereby guaranteeing stable operation.

Figure 9:
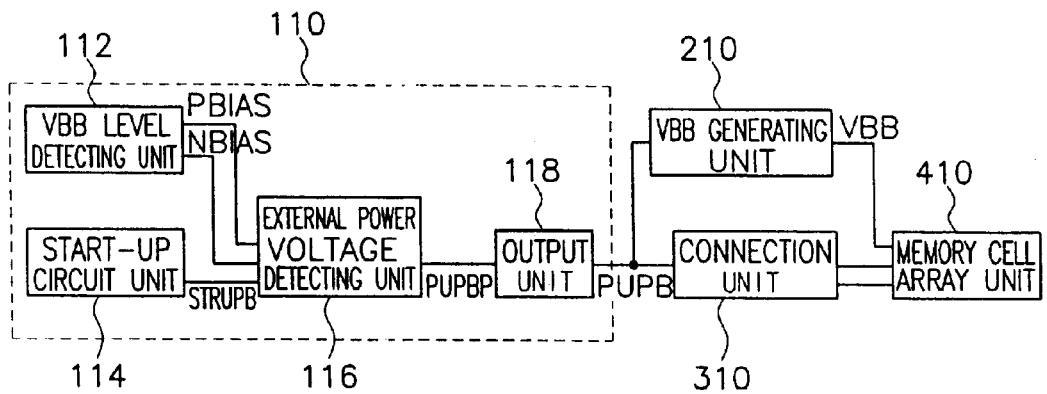
FIG. 9 is a block diagram illustrating a circuit for generating a power-up signal in accordance with a second embodiment of the present invention.

FIG. 9 is a block diagram illustrating a circuit for generating a power-up signal in accordance with a second embodiment of the present invention. As shown in FIG. 9, in a semiconductor memory device having a back bias voltage generating unit 210, a connection unit 310 and a memory cell array unit 410, the circuit for generating the power-up signal includes a VBB level detecting unit 112, a start-up circuit unit 114, an external power voltage detecting unit 116 and an output unit 118.

In the second embodiment of the present invention, the detecting signals PBIAS and NBIAS from the VBB level detecting unit 112 are inputted only to the external power voltage detecting unit 116, in contrast with the first embodiment shown in FIG. 2.

In the same manner, the VBB level detecting unit 112 generates signals PBIAS and NBIAS detecting the level of a back bias voltage VBB.

The external power voltage detecting unit 116 is controlled in response to the detecting signals PBIAS and NBIAS from the VBB level detecting unit 112, for generating a signal PUPBP detecting the external power voltage.

The external power voltage detecting unit 116 is initialized in response to a start-up signal STRUPB from the start-up circuit unit 114.

The start-up circuit unit 114 generates the start-up signal STRUPB setting an initial value of the external power voltage detecting unit 116.

The output unit 118 buffers the detecting signal PUPBP from the external power voltage detecting unit 116, and outputs a power-up signal PUPB.

The connection unit 310 receives the power-up signal PUPB from the output unit 118, and controls the source, drain and gate voltages of a memory cell transistor of the memory cell array unit 410.

Figure 10:
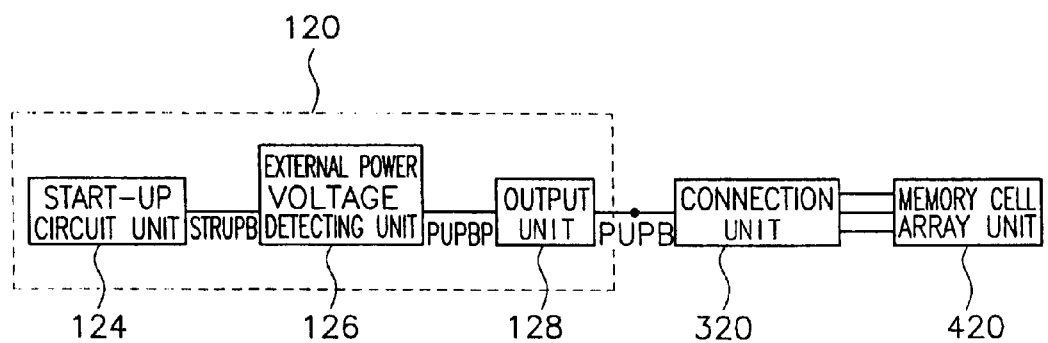
FIG. 10 is a block diagram illustrating a circuit for generating a power-up signal in accordance with a third embodiment of the present invention.

FIG. 10 is a block diagram illustrating a circuit for generating a power-up signal in accordance with a third embodiment of the present invention. As depicted in FIG. 10, in a semiconductor memory device having a connection unit 320 and a memory cell array unit 420, the circuit for generating the power-up signal includes a start-up circuit unit 124, an external power voltage detecting unit 126 and an output unit 128.

The third embodiment of the present invention does not employ the VBB level detecting unit 112, in contrast with the first embodiment shown in FIG. 2.

The external power voltage detecting unit 126 generates a signal PUPBP detecting an external power voltage in response to the active resistance ratio of a transistor.

The start-up circuit unit 124 generates a start-up signal STRUPB setting an initial value of the external power voltage detecting unit 126.

The output unit 128 buffers the detecting signal PUPBP from the external power voltage detecting unit 126, and outputs a power-up signal PUPB.

The connection unit 320 receives the power-up signal PUPB from the output unit 128, and controls the source, drain and gate voltages of a memory cell transistor of the memory cell array unit 420.

Figure 11:
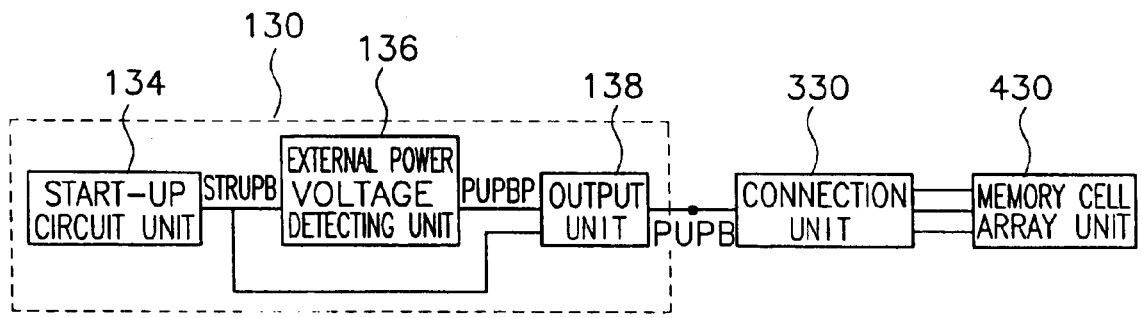
FIG. 11 is a block diagram illustrating a circuit for generating a power-up signal in accordance with a fourth embodiment of the present invention.

FIG. 11 is a block diagram illustrating a circuit for generating a power-up signal in accordance with a fourth embodiment of the present invention. As illustrated in FIG. 11, in a semiconductor memory device having a connection unit 330 and a memory cell array unit 430, the circuit for generating the power-up signal includes a start-up circuit 134, an external power voltage detecting unit 136 and an output unit 138.

In the fourth embodiment of the present invention, the output unit 138 is initialized in response to the start-up signal STRUPB from the start-up circuit unit 134, in contrast with the third embodiment shown in FIG. 10.

In the same manner, the external power voltage detecting unit 136 generates a signal PUPBP detecting an external voltage in response to the active resistance value of a transistor. The start-up circuit unit 134 generates the start-up signal STRUPB setting an initial value of the external power voltage detecting unit 136.

The output unit 138 is controlled in response to the start-up signal STRUPB from the start-up circuit unit 134, for buffering the detecting signal PUPBP from the external power voltage detecting unit 136, and outputting a power-up signal PUPB.

The connection unit 330 receives the power-up signal PUPB from the output unit 138, and controls the source, drain and gate voltages of a memory cell transistor of the memory cell array unit 430.

Figure 12:
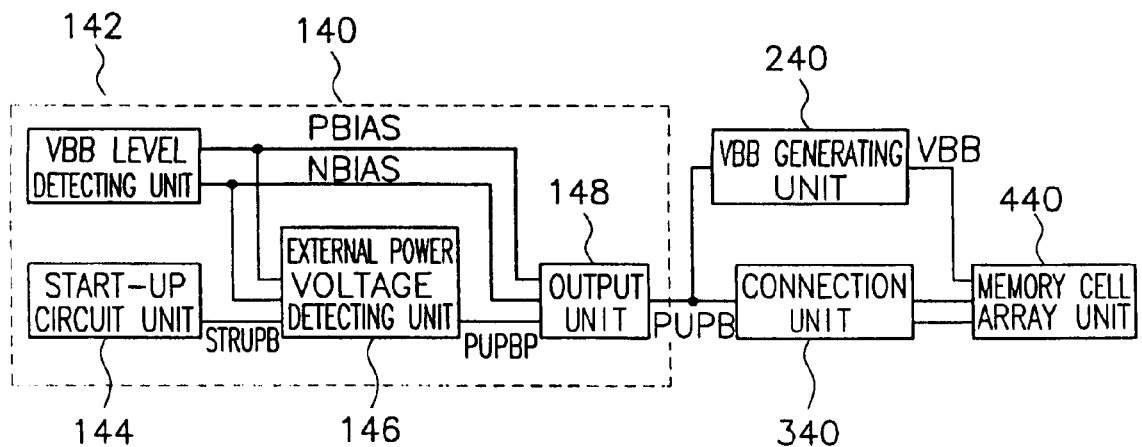
FIG. 12 is a block diagram illustrating a circuit for generating a power-up signal in accordance with a fifth embodiment of the present invention.

FIG. 12 is a block diagram illustrating a circuit for generating a power-up signal in accordance with a fifth embodiment of the present invention. Referring to FIG. 12, in a semiconductor memory device having an internal power voltage generating unit 240, a connection unit 340 and a memory cell array unit 440, the circuit for generating the power-up signal includes an internal power voltage detecting unit 142, a start-up circuit unit 144, an external power detecting unit 146 and an output unit 148.

In the fifth embodiment of the present invention, the internal power voltage detecting unit 142 is used instead of the VBB level detecting unit 102, and the internal power voltage generating unit 240 is used instead of the VBB generating unit 200, in contrast with the first embodiment shown in FIG. 2.

The internal power voltage detecting unit 142 generates signals PBIAS and NBIAS detecting the level of an internal power voltage. The external power detecting unit 146 is controlled in response to the detecting signals PBIAS and NBIAS from the internal power voltage detecting unit 142, for generating a signal PUPBP detecting an external voltage.

The start-up circuit unit 144 generates a start-up signal STRUPB setting an initial value of the external power detecting unit 146. The output unit 148 buffers the signal from the external power detecting unit 146, and outputs a power-up signal PUPB.

The connection unit 340 receives the power-up signal PUPB from the output unit 148, and controls the source, drain and gate voltages of a memory cell transistor of the memory cell array unit 440.

Figure 13:
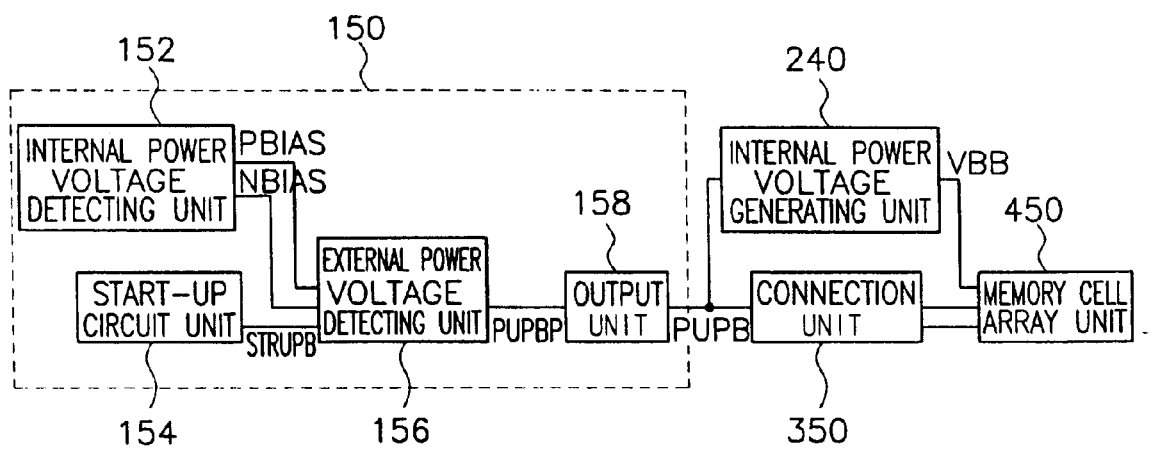
FIG. 13 is a block diagram illustrating a circuit for generating a power-up signal in accordance with a sixth embodiment of the present invention.

FIG. 13 is a block diagram illustrating a circuit for generating a power-up signal in accordance with a sixth embodiment of the present invention. As illustrated in FIG. 13, in a semiconductor memory device having an internal power voltage generating unit 250, a connection unit 350 and a memory cell array unit 450, the circuit for generating the power-up signal includes an internal power voltage detecting unit 152, a start-up circuit unit 154, an external power detecting unit 156 and an output unit 158.

In the sixth embodiment of the present invention, the detecting signals PBIAS and NBIAS from the internal power voltage detecting unit 152 are inputted only to the external power detecting unit 156, in contrast with the fifth embodiment shown in FIG. 12.

The internal power voltage detecting unit 152 generates signals PBIAS and NBIAS detecting an internal power voltage. The external power detecting unit 156 is controlled in response to the detecting signals PBIAS and NBIAS from the internal power voltage detecting unit 152, for generating a signal PUPBP detecting an external voltage.

The start-up circuit unit 154 generates a start-up signal STRUPB setting an initial value of the external power detecting unit 156, and the output unit 158 buffers the detecting signal PUPBP from the external power detecting unit 156, and outputs a power-up signal PUPB.

The connection unit 350 receives the power-up signal PUPB from the output unit 158, and controls the source, drain and gate voltages of a memory cell transistor of the memory cell array unit 450.

It is thus possible to prevent a latch-up due to non-generation of the internal power voltage of the memory cell by generating the power-up signal PUPB, by detecting the internal power voltage of the memory cell that is internally generated when the external power voltage is initially applied, and detecting the external power voltage when the internal power voltage reaches a predetermined level. In addition, the power-up signal PUPB is stabilized by initializing the external power detecting units 146 and 156 by using the start-up circuit units 144 and 154.

As discussed earlier, in accordance with the present invention, the initial value of the external power voltage detecting unit is set up by using the start-up circuit in the initial power-up operation, thereby stabilizing the power-up operation.

In addition, when the back bias voltage is below a specific level, the power-up signal is generated by detecting the external power voltage. Accordingly, the latch-up is not generated due to coupling of the source, gate and drain voltages of the memory cell transistor, by controlling generation of the gate, drain and bulk voltages of the memory cell transistor.

As the present invention may be embodied in several forms without departing from the spirit or essential characteristics thereof, it should also be understood that the above-described embodiments are not limited by any of the details of the foregoing description, unless otherwise specified, but rather should be construed broadly within their spirit and scope as defined in the appended claims, and therefore all changes and modifications that fall within the metes and bounds of the claims, or equivalents of such metes and bounds are intended to be embraced by the appended claims.

What is claimed is:

1. In a semiconductor memory device including an internal back bias voltage generating unit, a circuit for generating a power-up signal comprising:
   a VBB level detecting unit for detecting a back bias voltage level;
   an external power voltage detecting unit controlled in response to the signal from the VBB level detecting unit, for detecting an external power voltage level;
   a start-up circuit unit for setting an initial value of the external power voltage detecting unit;
   an output unit controlled in response to the output signal from the VBB level detecting unit, for buffering and outputting the signal from the external power voltage detecting unit; and
   a connection unit for receiving the signal from the output unit, and controlling the source, drain and gate voltages of a memory cell transistor.

2. In a semiconductor memory device including an internal back bias voltage generating unit, a circuit for generating a power-up signal comprising:
   a VBB level detecting unit for detecting a back bias voltage level;
   an external power voltage detecting unit controlled in response to the signal from the VBB level detecting unit, for detecting an external power voltage level;
   a start-up circuit unit for setting an initial value of the external power voltage detecting unit;
   an output unit for buffering the signal from the external power voltage detecting unit; and
   a connection unit for receiving the signal from the output unit, and controlling the source, drain and gate voltages of a memory cell transistor.

3. A circuit for generating a power-up signal in a semiconductor memory device, comprising:
   an external power voltage detecting unit for detecting an external power voltage in response to the active resistance ratio of a transistor;
   a start-up circuit unit for setting an initial value of the external power voltage detecting unit;
   an output unit for buffering the signal from the external power voltage detecting unit; and
   a connection unit for receiving the signal from the output unit, and controlling source, drain and gate voltages of a memory cell transistor.

4. A circuit for generating a power-up signal in a semiconductor memory device, comprising:
   an external power voltage detecting unit for detecting an external power voltage in response to the active resistance ratio of a transistor;
   a start-up circuit unit for setting an initial value of the external power voltage detecting unit;
   an output unit controlled in response to the output signal from the start-up circuit unit, for buffering the signal from the external power voltage detecting unit; and
   a connection unit for receiving the signal from the output unit, and controlling the source, drain and gate voltages of a memory cell transistor.

5. In a semiconductor memory device including an internal power voltage generating unit, a circuit for generating a power-up signal comprising:
   an internal power voltage detecting unit for detecting an internal power voltage level;
   an external power detecting unit controlled in response to the signal from the internal power voltage detecting unit, for detecting an external voltage level;
   a start-up circuit unit for setting up an initial value of the external power detecting unit;
   an output unit controlled in response to the signal from the internal power voltage detecting unit, for buffering the signal from the external power detecting unit; and
   a connection unit for receiving the signal from the output unit, and controlling the source, drain and gate voltages of a memory cell transistor.

6. In a semiconductor memory device including an internal power voltage generating unit, a circuit for generating a power-up signal comprising:
   an internal power voltage detecting unit for detecting an internal power voltage level;
   an external power detecting unit controlled in response to the signal from the internal power voltage detecting unit, for detecting an external voltage level;
   a start-up circuit unit for setting an initial value of the external power detecting unit;
   an output unit for buffering the signal from the external power detecting unit; and
   a connection unit for receiving the signal from the output unit, and controlling the source, drain and gate voltages of a memory cell transistor.

* * * * *